United States Patent [19]

Baker

[11] 4,286,175
[45] Aug. 25, 1981

[54] VMOS/BIPOLAR DUAL-TRIGGERED SWITCH

[75] Inventor: Richard H. Baker, Bedford, Mass.

[73] Assignee: Exxon Research & Engineering Co., Florham Park, N.J.

[21] Appl. No.: 40,989

[22] Filed: May 21, 1979

[51] Int. Cl.³ .................... H03K 17/04; H03K 17/06; H03K 17/60; H03K 17/687

[52] U.S. Cl. .................................. 307/581; 307/254; 307/315

[58] Field of Search ............... 307/241, 242, 243, 251, 307/253, 254, 255, 315; 357/23, 43, 46

[56] References Cited

U.S. PATENT DOCUMENTS

| | | | |
|---|---|---|---|
| 3,210,561 | 10/1965 | Ullman | 307/315 |
| 3,553,541 | 1/1971 | King | 357/43 |
| 3,879,619 | 4/1975 | Pleshko | 307/251 |
| 4,123,670 | 10/1978 | Pollmeier | 307/253 |
| 4,189,641 | 2/1980 | Akamatsu | 307/254 |

OTHER PUBLICATIONS

Barlage, "Switched Mode VMOS and Bipolar . . . ," Fifth National Solid-State Power Conversion Conf. (Powercon 5), Proceedings, Session D2, pp. D2-1 to D2-8, May 1978.

*Primary Examiner*—William D. Larkins
*Attorney, Agent, or Firm*—Kenneth Watov

[57] ABSTRACT

A relatively high-power switching device and circuit includes a first VMOS transistor which is turned on for supplying via its channel a first current to the base electrode of a bipolar transistor, for turning on the latter into at least an unsaturated conduction state, thereafter a second VMOS transistor is turned on for supplying a second current concurrently with the first current to the base electrode of the bipolar transistor, causing the latter to go into or close to saturation as possible, depending upon the characterstics of the load, for minimizing the power dissipation thereof during a major period of its conductive state. The second VMOS transistor has its channel connected between the base and emitter electrodes of the bipolar transistor, whereby when the former is conductive, in addition to supplying the second current, it also provides negative feedback between the collector and base electrodes of the bipolar transistor, thereby enhancing the transient capability of the bipolar transistor. The bipolar transistor is turned off by first turning off the first VMOS transistor, ensuring the former is placed into a non-saturated conduction state, and thereafter the second VMOS transistor is turned off, reducing the base current to zero, causing the bipolar transistor to turn off. In this manner the turn-on and turn-off times for the bipolar transistor can be minimized.

37 Claims, 7 Drawing Figures

*Fig_1_*

*Fig_2_*

*Fig_3_*

*Fig_5_*

_Fig_4_

_Fig_6_

Fig. 7.

VMOS/BIPOLAR DUAL-TRIGGERED SWITCH

CROSS-REFERENCED TO RELATED APPLICATIONS

This invention is related to my inventions, Ser. No. 41,008 filed on May 21, 1979, for VMOS/BIPOLAR POWER SWITCH, and Ser. No 40,991, filed on May 21, 1979, for VMOS/BIPOLAR SWITCHING DEVICE.

BACKGROUND OF THE INVENTION

The field of the present invention relates generally to power switching circuits and devices, and more specifically to such circuits and devices, including the combination of bipolar and field effect transistors.

It is known in the prior art to apply metal oxide semiconductors (MOS devices) for use in low power digital circuits, and to apply power bipolar transistors for relatively high-power applications. In general, as the power handling capability of a bipolar transistor is increased, its gain must be increased but its switching speed will decrease. Also, bipolar transistors have a positive temperature coefficient of current, which can lead to "thermal runaway" as certain areas of the bipolar transistor's substrate heat up under severe operating conditions, causing damage or destruction of the transistor when it is operated in parallel with like devices. Recently, a vertical metal oxide semiconductor (hereinafter referred to as VMOS) field effect transistor has been invented. The VMOS device has a very high static input impedance, and consequently requires extremely low drive power, because it is a voltage operated device with high power gain. VMOS devices provide very fast switching times, permit direct paralleling of devices without complicated biasing networks for switching high current levels, and have a negative temperature coefficient for current (a positive temperature coefficient for resistance), thereby providing negative feedback internal to the device which substantially eliminates the destructive thermal runaway problem of bipolar transistors. In the present state of the art, VMOS devices are available for handling voltages up to 400 volts at about 8 amperes of current. Unfortunately, the present high power VMOS devices have a relatively high on-resistance of about 1 ohm between their source and drain electrodes. This resistance causes relatively high power dissipation at high power levels. For example, assuming that 100 ampere VMOS devices will become available in the near future, but with little improvement in the series on-resistance of the device, about 10,000 watts will be dissipated at this magnitude of current. In comparison, bipolar power transistors typically have a resistance of less than 20 milliohms between their collector and emitter electrodes when conducting 100 amperes in a saturated state, but have the disadvantage of a relatively low value of input resistance, relatively low switching speed in comparison to a VMOS transistor, and other problems as previously mentioned.

SUMMARY OF THE INVENTION

The present inventor recognized that turn-on and turn-off times, and power dissipation of a relatively high-power bipolar transistor can be optimized by initially supplying a first current to the base electrode of the transistor to turn it on into a saturated conduction state, and thereafter supplying the first current concurrent with a second current to this base electrode, minimizing its power dissipation, and completing the turn-on cycle. The turn-off cycle is accomplished by removing one of the first or second currents from the base electrode, to place the transistor back into an unsaturated conduction state, and thereafter removing the remaining one of the first or second currents from the base electrode for completing the turning off of the transistor. In one embodiment of the invention, one of the first or second currents is supplied via a VMOS transistor having its channel connected between the collector and base electrodes of the bipolar transistor, whereby the VMOS transistor when conducting also provides negative feedback between the collector and base electrodes, thereby improving the transient capability of the bipolar transistor.

BRIEF DESCRIPTION OF THE DRAWING

In the drawings, wherein like elements are indicated by the same reference designation.

Note that the symbol shown for the VMOS device 47 in FIG. 1 has been devised by the present inventor in recognition that a standardized symbol for the VMOS device has not been accepted.

DETAILED DESCRIPTION OF THE PREFERRED EMBODIMENTS

Figures 1, 2, 3, 5:
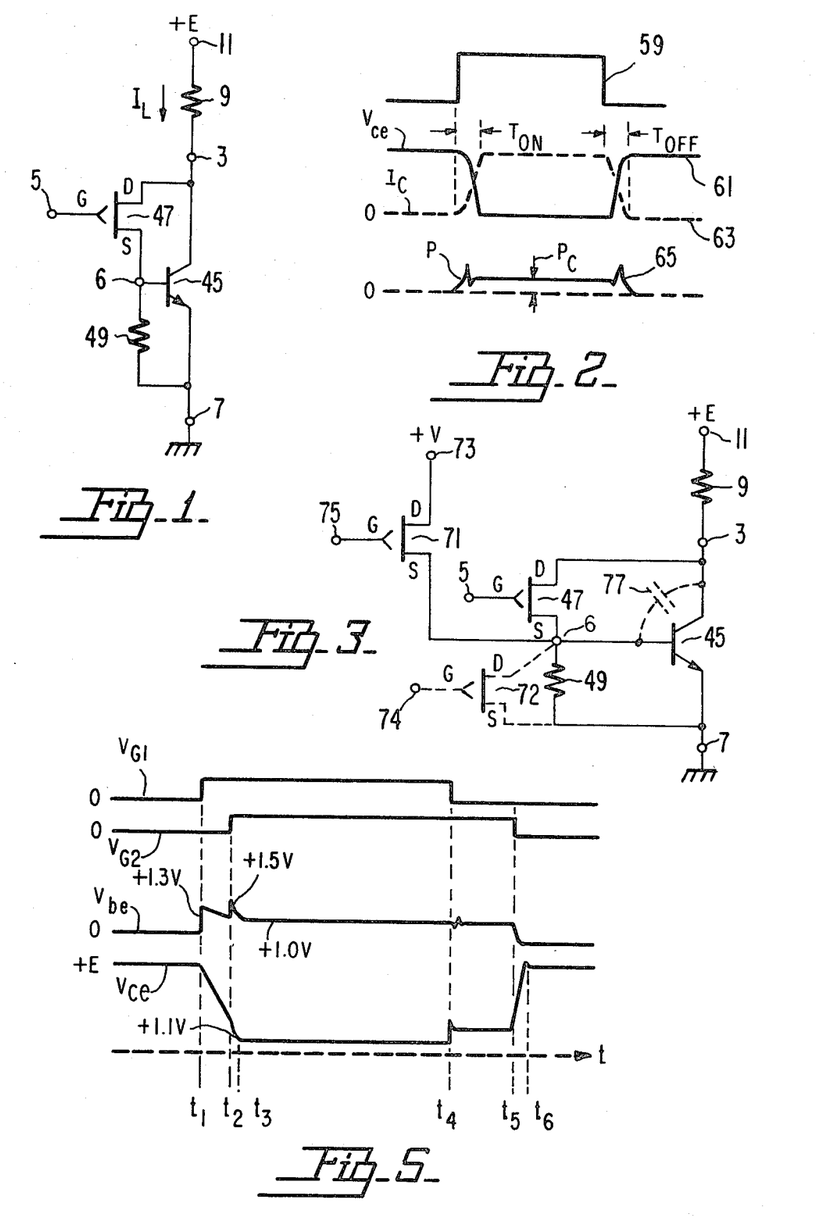
FIG. 1 shows a circuit schematic diagram of a switching circuit and device combining a VMOS transistor with a bipolar transistor, which is one embodiment of my invention, Ser. No. 41,008, filed on May 21, 1979, for VMOS/BIPOLAR POWER SWITCH.
FIG. 2 shows curves relating to the switching characteristics of the switching circuit and device of FIG. 1.
FIG. 3 shows a circuit schematic diagram of one embodiment of the present invention.
FIG. 5 shows curves relating to switching characteristics of the circuit of FIG. 5.

The present inventor devised the circuit of FIG. 1 to provide a relatively high-power solid-state switching device that overcomes the disadvantages of both power VMOS devices and bipolar transistors when used individually, as described in detail in Ser. No. 41,008. As shown, this related invention includes an NPN bipolar power switching transistor 45 connected with its collector electrode to the operating voltage terminal 3, and emitter electrode to the reference terminal 7. A load impedance 9 is connected between a power terminal 11 for receiving an operating voltage +E, and voltage terminal 3. A VMOS device 47 is connected with its drain D and Source S electrodes to the collector 3 and base 6 electrodes, respectively, of transistor 45, and its gate G electrode to the input or control terminal 5. A resistor 49 having a low value of resistance is connected between the base and emitter electrodes of the bipolar transistor 45, for insuring that the transistor 45 is held off when zero bias is applied to the gate electrode 5. The resistor 49 can be included internally or externally to this new combination 45,47, aptly named CSD (Combinational Semiconductor Device) by the inventor. This switching device 45,47 has the latching advantage of an SCR (Silicon-Controlled-Rectifier), and the additional advantage of providing for turn off by application of an appropriate signal at the gate of the VMOS 47.

Note that a plurality of such devices 45,47 can be deposited on the same substrate. Assuming that the plurality of such devices 45,47 are identical in electrical characteristics and equal in number to N, N being some integer number greater than 1, if the devices are connected in direct parallel, then the current carrying capability of the parallel connected devices will be equal to about N times the current carrying capability of an individual one of these devices. Alternatively, if a plurality N of these devices 45, 47 are connected in series with respect to their main current carrying paths (the collector-emitter electrode current carrying path of the bipolar transistor 45), and the gate electrodes of the VMOS 47 each individually referenced, then the voltage breakdown capability of these series connected devices 45,47 will be about N times the voltage breakdown capability of an individual one of these devices 45,47.

In operation of the device 45,47, if a pulse control signal 59 (see FIG. 2) is applied to the control terminal 5 or gate electrode of the VMOS 47, assuming that the level of voltage of the pulse 59 is high enough to fully turn on the VMOS device 47, the VMOS 47 will turn on to provide a current conduction path having a resistance of about 1 ohm (its drain-source electrode current path) between the collector and base electrodes of bipolar transistor 45. At this time, because the VMOS 47 turns on much faster than does the bipolar transistor 45, almost all of the load current $I_L$ is driven into the base electrode of bipolar transistor 45, overdriving the bipolar transistor 45, which greatly speeds up its transition to the high conduction state. This overdrive condition will occur for only a short period of time for, as shown in FIG. 2, the voltage $V_{ce}$ across the collector and emitter electrodes of the transistor 45 rapidly decreases as it turns on (see waveform 61), causing the base current supplied via the VMOS 47 to rapidly decrease, removing the overdrive condition. The VMOS device 47 provides negative feedback between the collector and base electrodes of bipolar transistor 45, and automatically adjusts the level of voltage between the collector and base electrodes of the bipolar transistor 45 to maintain the latter in a given state of conduction. Through laboratory tests, the inventor has determined that the device 45,47 typically stabilized at a level where the bipolar transistor 45 is conducting near the edge of saturation (in the linear region near saturation) but cannot go into saturation. In this manner, because of the very large overdrive for a short period during turn-on, the bipolar transistor switch 45 is turned on in about 0.5 microseconds. Therefore, the device 45,47 has a turn-on time $T_{ON}$ that is typically 4 times better than can be obtained with the bipolar switching device alone. Note that as transistor 45 turns on, its collector current $I_c$ (see waveform 63) rapidly increases from a relatively low value (leakage current) to a substantially high value at equilibrium operation of the device 45,47. The voltage level of the control pulse 59 can be adjusted to different levels for controlling the level of conduction of the bipolar transistor 45 in a range between cutoff and the edge of saturation, for certain applications. In typical switching applications, the level of pulse 59 is made high enough to cause the bipolar transistor 45 to operate at the edge of saturation. If some transient demand occurs, causing the load current $I_L$ to suddenly increase, whereby bipolar transistor 45 is pulled further away from saturation, causing the voltage across its collector-emitter electrodes to suddenly increase, transistor 47 responds by providing a feedback path for driving more base current into the base electrode of transistor 45, causing bipolar transistor 45 to conduct harder and consequently move back towards the edge of saturation. The increased conduction of transistor 45 forces the voltage across the collector-emitter electrodes to decrease. In this manner, the negative feedback action provided by the VMOS device 47 improves the transient overload capability of the bipolar transistor 45 by factor of at least 5 times its normally rated transient current capability. The switching device 45,47 can be used to drive loads, such as the windings of an electric motor. Also, because of the positive temperature coefficient for resistance between its drain and source electrodes, the VMOS transistor 47 automatically stabilizes the bipolar transistor 45 and prevents it from going into thermal runaway when a plurality of such switching circuits 45,47 are connected in parallel.

Assuming, for example, that the load current is about 44 amperes in magnitude and that the DC current gain B of bipolar transistor 45 is about 10, then at equilibrium of the device 45,47, about 4 amperes of current will flow through VMOS 47 (its "on" resistance $r_s$ being about 1 ohm) into the base electrode of bipolar transistor 45, causing the latter to conduct about 40.0 amperes of current $I_c$ through its collector-emitter current path, with a voltage $V_{ce}$ thereacross of about 5 volts, and a voltage $V_{be}$ across its base-emitter electrodes of about 1.0 volt. Under the equilibrium conditions cited, the power $P_c$ being dissipated by the device (see FIG. 2) is about 220 watts as derived from the following equation:

$$P_c = I_c V_{ce} + (I_L/\beta)^2 r_s + (I_L/\beta) V_{be} \qquad (1)$$

Since the bipolar transistor 45 is allowed to only operate to the edge of saturation, the charge storage time $t_s$ of the combination semiconductor device 45,47 is equal to substantially zero, whereas when the bipolar transistor 45 is driven into saturation, it has a storage time of at least several microseconds. In response to the trailing edge of the control pulse 59, the VMOS transistor 47 typically turns off in 0.05 microseconds, and the bipolar transistor (operating out of saturation) about 0.45 microseconds later. Accordingly, the turn-off time $T_{OFF}$ for the combinational semiconductor device 45,47 is about 0.5 microseconds. This is compared to a turn-off time from saturation of typically 3.7 microseconds for the transistor 45 alone.

For reference purposes herein, the turn-on time $T_{ON}$ for bipolar transistors includes the sum of a delay time $t_d$ and a rise time $t_r$. The delay time is defined as the time for the collector current to go from an off state to 10% of its final value state of the bipolar transistor after a turn-on pulse is applied to the base electrode of the transistor. The rise time is defined as the time for the collector current to go from 10% of its final on value to 90% of its final on value. The delay time $t_d$ is caused by stored charge at the emitter and collector junctions of the bipolar transistor. When the base-emitter junction of the transistor is reverse biased, causing the transistor to be turned off, charge is stored in the depletion layer around the emitter. Also at this time, the collector is reverse biased by both the operating voltage applied to the collector electrode and the reverse bias voltage being applied to the base electrode, causing charge to be stored in capacitances associated with the collector. When the base-emitter junction becomes forward biased, the stored charge at the emitter and collector junctions must be changed to a new value to begin the turn-on cycle for the bipolar transistor. The time required to effect this change in charge is the delay time $t_d$. The rise time $t_r$ involves the previously mentioned capacitances because these capacitances are still undergoing a change in charge due to the continuing decrease in the level of the collector voltage as the bipolar transistor continues its turn-on toward saturation. In addition, the rise time $t_r$ is also effected by both the charging of the collector capacitances via a collector series resistance between the base and collector electrodes, and the base transit time.

The turn-off time $T_{OFF}$ for a bipolar transistor includes the sum of the storage time $t_s$ and the fall time $t_f$. The storage time is defined as the time for the magnitude of the collector current to change from its value when the bipolar transistor is in saturation to 90% of its final value after a turn-off pulse is applied to the base electrode of the transistor. The fall time $t_f$ is defined as the time for the collector current to go from 90% of its saturation value to 10% of its saturation value. The storage time $t_s$ is related to the time required for minority carriers in the base and collector regions to recombine for producing a charge distribution placing the transistor just at the edge of saturation. The fall time $t_f$ depends upon change in the level of charge in the emitter and collection junction capacitances, and is equivalent to the reverse process of charge change involved in the rise time $t_r$.

A previously described, the combinational semiconductor device 45,47 reduces the effect of the interelectrode capacitances in turning on and turning off the bipolar transistor 45, by momentarily overdriving the transistor 45 during the turn-on cycle, and by operating the transistor 45 at the edge of saturation to minimize storage time effects during the turn-off cycle. However, the present inventor recognized that by operating the bipolar transistor 45 near the edge of but not in saturation, that the power dissipation of the transistor 45 is substantially greater than if it were operating in a saturated state. For example, a typical bipolar power transistor operating near the edge of but not in saturation may have a voltage drop between its collector and emitter electrodes of about 5 volts, whereas if this same transistor is operating in saturation, this voltage reduces to about 1 volt. Accordingly, from equation (1) where it is shown that the power dissipated by the main current path of the transistor 45 is equal to the product of $I_c V_{ce}$, such a transistor operating in saturation will have 5 times less power dissipation than if the transistor was operating in non-saturated conduction state. For this reason, the present inventor recognized that for power levels above about 2 kilowatts, it is desirable to operate the bipolar transistor 45 in a saturated state during the major period of time it is conducting current.

A first embodiment of the present invention, as shown in FIG. 3, includes the addition of a second VMOS transistor 71 to a combinational semiconductor device 45,47 (may also include resistor 49) of the present inventor's previously mentioned related invention, for permitting the bipolar transistor 45 to be turned on into or as close to saturation as possible (depending upon the impedance of the load, for example), during a substantial period of its conductive state, as will be described. The VMOS transistor 71 has its drain electrode D connected to an operating voltage terminal 73 for receiving a voltage $+V$, a source electrode S connected to base terminal 6, and a gate electrode G connected to signal terminal 75. The collector to base interelectrode capacitance of the bipolar transistor 45 is shown in phantom by the capacitor 77. In operating the present circuit, for example, a first pulse having a positive polarity of appropriate amplitude is applied to control terminal 75 to turn on VMOS transistor 71, which transistor substantially lowers the impedance between its drain and source electrodes for permitting current to flow from operating voltage terminal 73 into the base electrode of bipolar transistor 45. In general, the value of the operating voltage $+V$ is substantially less than that of the value of the operating voltage $+E$ applied to operating voltage terminal 11. Also, the value of operating voltage $+V$ is set at a level for providing a magnitude of base current equal to $(V/r_s)$, where $r_s$ is the channel resistance of VMOS transistor 71 when conductive, for turning on transistor 45 into or as close to a saturated conduction as possible (dependent upon the characteristics of the load 9, for example). Note that the transistor 71, although shown as a VMOS transistor, can also be provided by other low power high speed switching transistors. Also note that if the time between $t_1$ and $t_2$ is of sufficient duration, an inductive load (for example) will be an open circuit at time $t_1$, but by time $t_2$ will be a relatively low impedance, due to only static flux at $t_2$ causing transistor 45 to come out of saturation, assuming that resistor 9 has sufficiently low value of resistance. Ideally, just after transistor 45 so turns on, a second pulse having a positive polarity and appropriate level of voltage is applied to control terminal 5 for turning on VMOS transistor 47. The magnitude of the base current now being supplied to transistor 45 is equal to the sum of the first current being supplied from transistor 71 and the second current now being supplied via transistor 47. Note that as previously mentioned, if the load is a heavy load (relatively low impedance), it may not be possible to drive transistor 45 into saturation. The circuit of FIG. 3 operates in the manner described for turning on transistor 45 into or as near saturation as possible, by turning on transistor 71 before transistor 47, in order to avoid turning on transistor 47 at a time when the voltage at the collector of transistor 45 is at a maximum value. In this manner, the initial magnitude of current that flows through the drain-source main current path of transistor 47 is substantially reduced when it is first turned on. In other words, by turning on transistor 71 before transistor 47, causing transistor 45 to turn on into a saturated conduction state, for example, the voltage at the collector of transistor 45 will substantially decrease when this transistor is so turned on, thereby substantially reducing the magnitude of current that will flow through the main current path of transistor 47 when the latter is turned on to complete the turn-on sequence. The time between $t_1$ and $t_2$ can be reduced to substantially zero, in applications where the load impedance is such that transistor 45 is readily saturated and operated at nominal power levels relative to its rated power. Transistor 45 is turned off from its saturated conduction state, for example, by typically removing in sequence the control pulses from gate terminal 75 first and then from gate terminal 5. In this manner, transistor 45 is turned off by first placing it back into its unsaturated conduction satate for a brief period of time, prior to completely reducing the magnitude of the base current to zero for completing the turn-off of this transistor.

A VMOS transistor 72, shown in phantom in FIG. 3, can be substituted for resistor 49. When operating with transistor 72 in lieu of resistor 49, transistor 72 is maintained in a non-conductive state during the times that either or both of transistors 71 and 47 are conducting. The impedance between the drain and source electrodes of transistor 72 is substantially high when this transistor is non-conductive, and for purposes of this discussion is considered so high as to create a virtual open circuit between these electrodes. Accordingly, no base current is diverted away from transistor 45 during the time that transistors 47 and 71 are turned on. If resistor 49 is used in place of transistor 72, as previously described, some base current will continuously be diverted away from transistor 45, via resistor 49, to a source of reference potential, power ground in this example, during the period of time that transistor 45 is turned on. This diversion of base current reduces the operating efficiency of the circuit of FIG. 3. With transistor 72 in place, coincident with turning off transistor 47, a "high" or positive polarity signal is applied to gate terminal 74, for turning on transistor 72, which responds by substantially lowering the impedance between its drain and source electrodes to typically 0.2 ohm to 1 ohm for providing the function of resistor 49; namely, to ensure that base-emitter junction of transistor 45 has zero volt across it at times that zero bias is applied to the base electrode thereof, ensuring fast turn-off of this transistor. In this manner, the substitution of transistor 72 for resistor 49 improves the operating efficiency of the circuit of FIG. 3. Note that VMOS transistor 72 can be replaced by other known solid-state switches. For example, a bipolar switching transistor having its main current path connected between base terminal 6 and reference terminal 7 will provide the same function as transistor 72.

By controlling the magnitude of the current supplied to the base electrode of transistor 45 in steps, for first driving this transistor on towards a saturated conduction state, but not necessarily into saturation depending upon the characteristics of the load impedance, and thereafter into or as close to a saturated conduction state as possible (again depending upon the characteristics of the load), the effects of the delay ($t_d$) and rise ($t_r$) times are minimized. It is preferred, if possible, to operate transistor 45 in a saturated conduction state during a substantial period of the time that it is conducting current, in order to minimize its power dissipation, as previously mentioned. Also, by first changing the conduction state of transistor 45 from a saturated to an unsaturated state, just prior to turning this transistor completely off, minimizes the effects of the storage time. In practice, the present inventor has determined that by carefully controlling the phase relationship between the leading and trailing edges of the first and second control pulses, that a bipolar power transistor operated in a dual triggering configuration as described for the circuit of FIG. 3, can typically be turned on into a saturated conduction state from cutoff state, in about 60% less time than turning on from cutoff directly to a saturated conduction state in known single triggering configurations. Similarly, this same transistor can typically be turned off in 250% less time from saturated conduction state to cutoff using the present dual triggering method, than directly from a saturated conduction state into cutoff using known single triggering methods.

Figure 4:
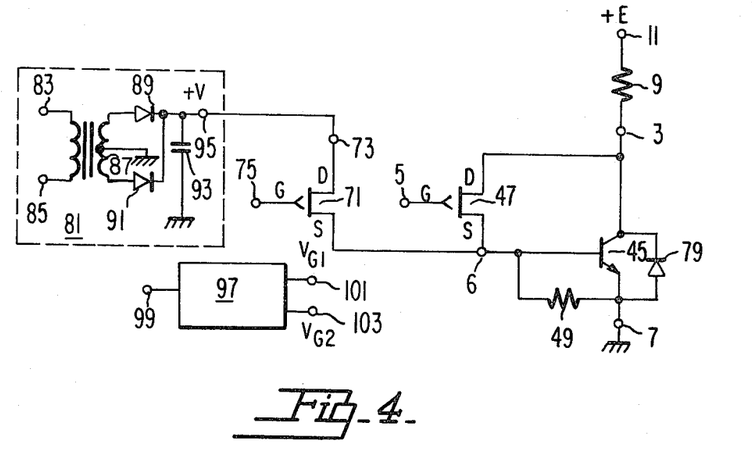
FIG. 4 shows a circuit schematic diagram of another embodiment of the invention.

A circuit schematic diagram of a second embodiment of the invention is shown in FIG. 4. This second embodiment of the invention includes the first embodiment of FIG. 3 and also a diode 79 connected in inverse parallel with the bipolar power transistor 45 to permit bilateral current flow (as would be known to one skilled in the art), a low voltage rectifier 81, and a controller 97. The rectifier 81 includes a pair of input terminals 83,85 for receiving an a.c. voltage, a transformer 87, a pair of rectifying diodes 89,91, a filter capacitor 93, and an output terminal 95 where the operating voltage +V is developed. The controller 97 can be provided by a logic network responsive to an input signal being "high" at input terminal 99, for producing first and second pulse-like control signals $V_{G1}$ and $V_{G2}$, at output terminals 101 and 103, respectively. The pulse signals $V_{G1}$ and $V_{G2}$ are applied to control terminals 75 and 5, respectively, for operating the transistor switches 71,47 and bipolar power switching transistor 45, as previously described. As shown in the waveform and timing diagram of FIG. 5, it is preferred that the leading edge of control pulse $V_{G1}$ lead the leading edge of the control pulse signal $V_{G2}$ by at least the time necessary for turning on transistor 71 to supply base current to transistor 45, for reducing the level of voltage across the collector and emitter electrodes of transistor 45. It is also preferred that the trailing edge of the first control pulse $V_{G1}$ lead the trailing edge of the second control pulse $V_{G2}$ by a period of time at least equal to the storage time of the transistor 45. At time $t_1$, the first control pulse $V_{G1}$ goes positive and is applied to control terminal 75 for turning on transistor 71. When VMOS transistor 71 turns on, the resistance $r_{s71}$ between its drain D and source S electrodes substantially decreases from 100 megohms to about 0.3 ohms. In a typical circuit, +V from bias supply 81 could be +2.7 volts unloaded, and about one diode drop (0.7 volt) less when loaded, or +2.0 volts. At time $t_1$, just after transistor 71 turns on, the voltage between the base and emitter electrodes ($V_{be}$) of bipolar transistor 45 is about +1.3 volts. Accordingly, when VMOS transistor 71 turns on, the magnitude of current $I_{bl}$ applied to the base of transistor 45 is derived from equation (2) below:

$$I_{bl} = +V - V_{be}/r_{s71} \qquad (2)$$

where at time $t_1$ (+V=2.7 volts, $V_{be}$=1.3 volts, and $r_s$=0.3 ohms) this magnitude of $I_{bl}$=4.6 amperes. $I_{bl}$ is a tansient overdrive current which decays to about 3.3 amperes by time $t_2$ (+V=2.0 volts, $V_{be}$=1 volt) with a time constant $\gamma_1$ calculable from equation 3:

$$\gamma_1 = r_{s71} C_1 \qquad (3)$$

where $C_1$ is the capacitance of capacitor 93. This transient overdrive (extra base current to transistor 45 of about 1.3 amperes, in this example) causes transistor 45 to turn on rapidly (typically within 0.3 microseconds) into a saturated conduction state when driving an inductive load (not shown) connected in series with resistor 9 between terminals 3 and 11, or an unsaturated conduction state when driving a capacitive load (not shown) connected between terminals 3 and 7, for example, yielding faster switching time and lower transient power dissipation of transistor 45 during turn-on, than could be obtained without using base overdrive at turn-on. As shown in this example, by time $t_2$ the voltage between the collector and emitter electrodes ($V_{ce}$) of transistor 45 has fallen to about 25% of its maximum value at cutoff of this transistor (for example, from 400 volts to 100 volts). At time $t_2$, the second control pulse or signal $V_{G2}$ goes positive, and is applied to control terminal 5 for turning on VMOS transistor 47, which substantially reduces the resistance $r_{s47}$ between its drain D and source S electrodes (typically from 100 megohms to about 1 ohm). The reason that VMOS transistor 47 has a 1 ohm "on resistance" in comparison to 0.3 ohm for VMOS 71, is that the latter is a much lower voltage VMOS device than the former. The magnitude of base current $I_{b2}$ applied to the base of transistor 45 via turn-on of transistor 47 is derived from equation 4:

$$I_{b2} = (V_{ce} - V_{be})/r_{s47} \qquad (4)$$

where, for this example, at time $t_2$, $V_{ce}$ is about 100 volts, and $V_{be}$ steps from +1.0 volts to about +1.5 volts, yielding a magnitude for $I_{b2}$ of about 98.5 amperes just after turn-on of transistor 47. This current $I_{b2}$ is an extra large transient overdrive current which decays to zero (actually goes negative) when transistor 45 enters the saturated mode. Note that at time $t_3$, transistor 45 is typically conducting in saturation. The total base current $I_{bT}$ at any given time is:

$$I_{bT} = I_{b1} + I_{b2} \qquad (5)$$

where as illustrated for this example, at time $t_1$ $I_{bT} = 4.6$ amperes, at $t_2$ $I_{bT} = 101.8$ amperes ($I_{b1} = 3.3$, $I_{b2} = 98.5$), and at $t_3$ $I_{bT} = 3$ amperes ($I_{b1} = 3.3$, $I_{b2} = 0.3$). The period between times $t_2$ and $t_3$ is a fraction of a microsecond (the waveforms of FIG. 5 are shown out of scale for purposes of explanation). In practice, the $V_{ce}$ of transistor 45, when conducting in saturation, can typically range from 0.2 volt to 1.1 volt, depending upon the magnitude of the load current (substantially determined by value of +E and of load impedance 9). It has been determined that the present method of dual triggering decreases significantly the switching loss (peak dissipation) of transistor 45 during turn-on.

The above calculations were made assuming that the resistor 49 had an infinite resistance or was out of the circuit. In practice, this resistor 49 is a low value, perhaps as low as 1.0 ohm. With 1.0 ohms and from times $t_3$ to $t_4$ the $V_{be}$ of transistor 45 is equal to 1.0 volts, then 1.0 ampere of current actually flows through resistor 49 and 2.4 amperes into the base of transistor 45. Assuming that transistor 45 has a current gain ($\beta$) equal to 30, that load resistor 9 ($R_9$) has a resistance of 6.67 ohms, and +E is 400 volts, then the load current $I_L$ given by:

$$I_L = +E/R_9 \qquad (6)$$

is about 60 amperes. Assume that 2.3 amperes of base current is sufficient to cause transistor 45 to be driven into saturation. The total efficiency $\eta$ of the circuit of FIG. 4 between $t_3$ and $t_4$ is:

$$\eta = \frac{\text{Power OUTPUT}}{\text{Power INPUT}} \times 100\% \qquad (7)$$

Power OUTPUT = $+E(I_L)$             (8)

Power INPUT = $+E(I_L) + V(I_{b1}) + r_{s71}(I_{b1})^2 +$ (9)
$I_{R49}^2(R_{49}) + V_{ce}(I_c) + r_{s47}(I_{b2})$ where $I_c$ is the collector current of transistor 45, and for this example is about 59.9 amperes between times $t_3$ and $t_4$. Accordingly, in this example, from equations 7, 8 and 9, between $t_3$ and $t_4$, the power output is about 24 kilowatts, and the power input is about [400(60)+2(3.3)+0.3(3.3)²+1(1)+1.1   59.9)+1(0.1)²] or 24.07 kilowatts, yielding an efficiency $\eta$ of about 99.68%.

The turn-off cycle is initiated at time $t_4$, when $V_{G1}$ goes typically from +12 volts to 0 volts in amplitude, causing transistor 71 to turn off. As a result $I_{b1}$ drops to 0 amperes, and the base current must now be wholly supplied via VMOS 47, that is, through the 1.0 ohm on-resistance of this transistor 47. In response to the sudden drop in base current, transistor 45 comes out of saturation and increases its $V_{ce}$ to a value calculable from equation (10):

$$V_{ce} = (I_L/\beta)(r_{s47}) + V_{be} \qquad (10)$$

where in this example, between time $t_4$ and $t_5$, $V_{be}$ is 1 volt (see FIG. 5), $\beta = 30$, $r_{s47} = 1$, and $I_L$ is about 60 amperes, giving a $V_{ce}$ of about 3.0 volts. Thus, transistor 45 is operating in an unsaturated state between times $t_4$ and $t_5$, substantially reducing the effects of storage time $t_s$ in completing the turning off of this transistor at $t_5$. At time $t_5$, control pulse $V_{G2}$ goes "low" (reduces in amplitude from typically +12 volts to 0 volt), turning off VMOS transistor 47, which raises the impedance between its source and drain electrodes to about 100 megohms, reducing $I_{b2}$ to zero. Bipolar transistor 45 rapidly turns off, and is completely cut off or nonconducting by time $t_6$. As shown above, the present method of dual triggering provides transient overdrive for rapid turn-on of a bipolar transistor, and turn-off from an unsaturated state of this transistor, for rapid turn-off thereof. Note that the short-lived transients in $V_{be}$ and $V_{ce}$ just after $t_4$, and in $V_{ce}$ just before $t_6$ are caused by the interelectrode capacitance of the VMOS devices and the delay time around the positive feedback loop.

Figure 6:
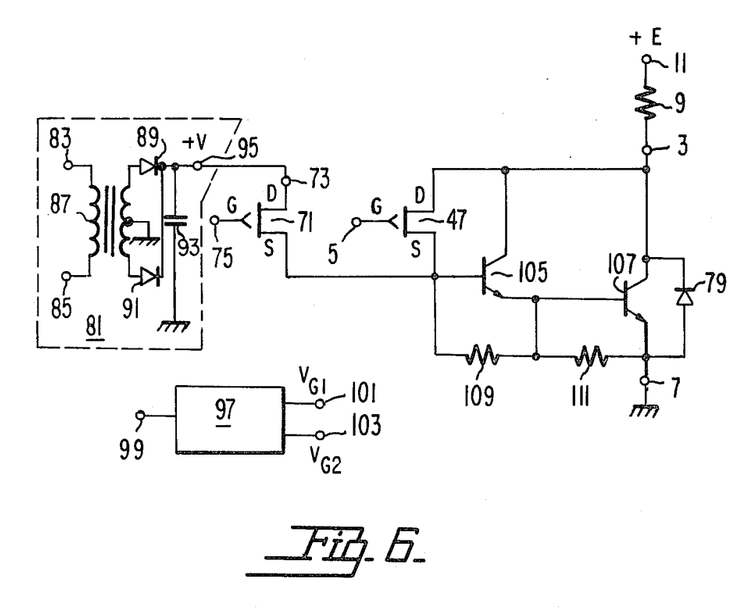
FIGS. 6 and 7 show circuit schematic diagrams of yet other embodiments of the invention.

The present method of dual triggering can be used to drive bipolar transistors 105,107 connected in a Darlington configuration, as shown in FIG. 6. Low value resistors 109 and 111 are connected between the base and emitter electrodes of transistors 105 and 111, respectively, to ensure turn-off thereof with zero bias at their respective base electrodes. This third embodiment of the invention permits higher output current levels to be attained in comparison to the circuit to FIG. 4. In other respects, the operation of the circuit of FIG. 6 is substantially the same as that given for the circuit of FIG. 4.

Figure 7:
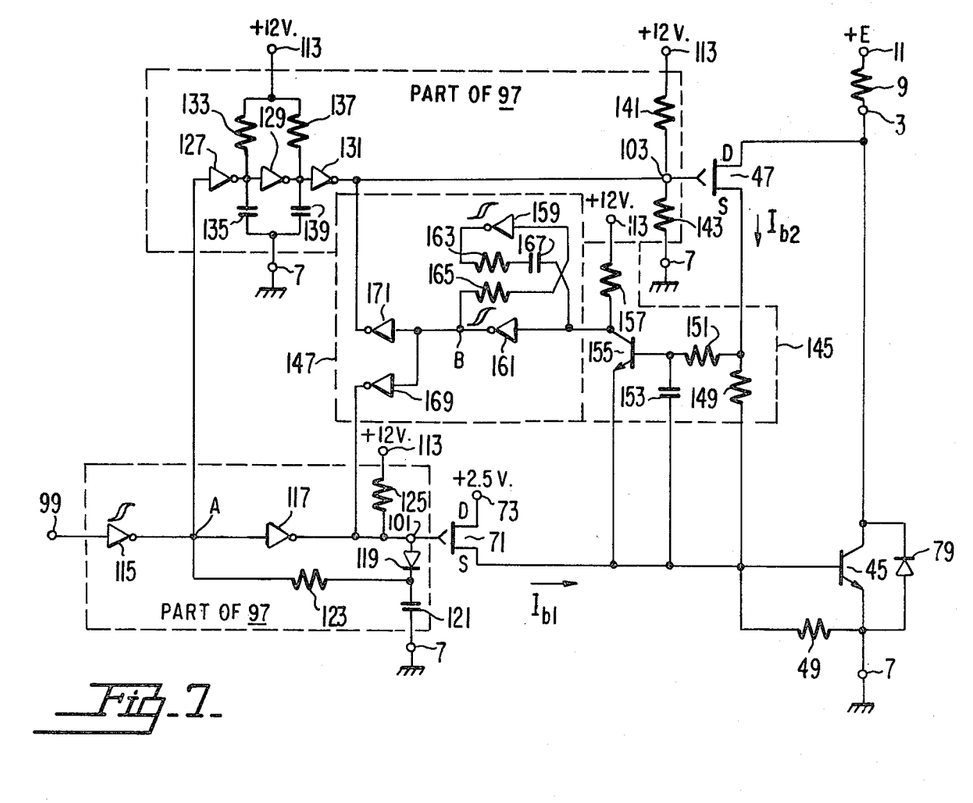

In FIG. 7, a fourth embodiment of the invention is shown. The controller 97, shown in block form in FIGS. 4 and 6, is shown in detail in FIG. 7. A logic level operating voltage of +12 volts, for example, is applied to operating voltage terminal 113 of controller 97. The turn-on cycle for transistor 45 is initiated by applying a "high" or positive level input signal at input terminal 99. In response to this "high" input signal, hysteresis inverter 115 changes the level at point A from a "high" (about +12 volts) level, to a "low" (0 volt) level. Inverter 117 responds to this change in level at A by changing the level of $V_{G1}$ at terminal 101, from "low" to "high" for turning on transistor 71. (Note that the +12 volts and +2.5 volts operating voltages are shown as typical values, for purposes of illustration.) As previously described, when transistor 71 turns on, base current $I_{b1}$ is supplied to the base of transistor 45 for turning on the latter to the conducting state. The combination of diode 119, capacitor 121, and resistors 123 and 125, provides means for initially turning on transistor 71 to a high conductivity state for overdriving transistor 45 with a large magnitude of base current $I_{b1}$ and thereafter lowering the conductivity of transistor 71, for reducing to a "safe level" the magnitude of base current $I_{b1}$, shortly after transistor 45 turns on. More specifically, when the input signal is "low", inverter 115 operates to raise the level at point A to about +12 volts, in this example, causing capacitor 121 to charge via resistor 123 to a level where the voltage across the capacitor 121 is about +12 volts. When the input signal goes "high", inverter 115 operates to make the level of voltage at point A low, whereby as previously described, inverter 117 responds by changing the level of voltage at terminal 10 from 0 volt to about +12 volts. Subsequently, capacitor 121 begins to discharge current via resistor 123 to point A. As capacitor 121 discharges, the voltage thereacross decreases exponentially towards 0 volt, permitting diode 119 to gradually become forward biased, causing current to flow from terminal 113, through the series circuit of resistors 125 and 123, and diode 113 to point A. In a time period determined primarily by the values of capacitor 121 and resistor 123, and secondarily by value of resistor 125, the voltage at terminal 101 is exponentially decreased from +12 volts to a lower level determined by substantially the ratio of the value of (resistor 123 plus the forward resistance of diode 119) to (the sum of the values of resistors 125 and 123, and the forward resistance of diode 119). At this equilibrium point, capacitor 121 will cease discharging and have a voltage thereacross of about one diode drop (0.7 v) less than the ultimately decreased voltage at terminal 101. As the voltage at terminal 101 so decreases from +12 volts to the lower equilibrium voltage, transistor 71 is changed from a high conductivity state to a lower conductivity state (the lower the conductivity state the higher the value of $r_{s71}$), causing the magnitude of the base current $I_{b1}$ to decrease to a "safe level," as previously described.

A short time after $V_{G1}$ goes "high" at terminal 101, the series string of inverters 127, 129, and 131 responds to the voltage at point A going "low" by operating to produce a "high" level for $V_{G2}$ at terminal 103. As previously described in the operation of FIG. 4, $V_{G2}$ typically goes high about 0.3 microseconds after $V_{G1}$, or is the time required for the $V_{ce}$ of transistor 45 to drop to about 25% of its maximum value. This delay time is provided by both the delay of three inverters (127, 129, 131) in the $V_{G2}$ channel versus one inverter (17) delay in the $V_{G1}$ channel, and the appropriate choice of values for resistor 133 and capacitor 135 forming a first timing integrator, and for resistor 137 and capacitor 139, forming a second timing integrator. The value of $V_{G2}$ when "high", that is, when the output voltage from inverter 131 is "high", is determined by the ratio of resistor 143 to the sum of resistors 141 and 143. In this example, $V_{G2}$ "high" is obtained from equation (11):

$$V_{G2} \text{ "High"} = +12 \left[ \frac{R_{143}}{R_{143} + R_{141}} \right] \text{ Volts} \quad (11)$$

To protect bipolar transistor 45 from excessive power dissipation due to faults, such as a partial short circuit across load 9, for example, a fault protection circuit is provided including a reflected load current monitoring circuit 145, and a local trip circuit 147. The monitoring circuit 145 includes a monitoring resistor 149, a timing or integrating circuit consisting of resistor 151 and capacitor 153, transistor 155, and collector resistor 157. If, after both $V_{G1}$ and $V_{G2}$ have gone "high" for turning on transistors 71 and 47, respectively, and bipolar transistor 45 into saturation, as previously described, a fault occurs and causes excessive current to flow into the collector of transistor 45, its $V_{ce}$ will increase as this transistor starts to come out of saturation. The increased $V_{ce}$ in turn causes additional current to flow through the on-resistance $r_{s47}$ (typically 1 ohm) of VMOS 47 and sensing or monitoring resistor 149 into the base of transistor 45. As previously described, this extra base current via positive feedback from VMOS 47 improves the over current capability of transistor 45. In addition, this feedback current to the base "reflects" changes in the load current, which causes the level of the voltage drop across monitoring resistor 149 to vary in direct proportion. When the feedback base current $I_{b2}$ causes the voltage across resistor 149 to exceed about 0.7 volt (1 $V_{be}$ of transistor 155) for a brief period of time set by the values of resistor 151 and capacitor 153, after which time capacitor 153 charges to a level where 1 $V_{be}$ volts or greater are developed across it, transistor 155 is turned on in response thereto. When transistor 155 so turns on, the voltage at its collector electrode substantially decreases from +12 V towards about +1 V (voltage across resistor 49), triggering a flip-flop (comprises hysteresis inverters 159, 161, resistors 163, 165, and capacitor 167) of trip circuit 147. Such triggering of this flip-flop causes the level at point B to change from "low" to "high". Inverters 169 and 171 of trip circuit 147 respond to the change in level at point B to a "high" level, and operate to apply a "low" or zero voltage at terminals 101 and 103, respectively. In response to these "low" signals at terminals 101 and 103, transistors 71 and 47, respectively turn off reducing the magnitude of the base current to zero, in turn causing transistor 45 to turn off. In this manner transistor 45 is protected from overdissipation and possible damage. If desired, the level of voltage at point B, for example, could be monitored by a system controller (not shown) for a fault condition, in order to completely shut down in the event of a fault in the system in which the circuit of FIG. 7 is operating.

Output transistor 45 is further protected by current limiting. Such current limiting is accomplished by selecting the values of resistors 141 and 143 for obtaining a "high" level for $V_{G2}$ that causes VMOS 47 to act as current source for a desired magnitude of base current $I_{b2}$. This magnitude is made slightly larger than that necessary for tripping the load current monitoring circuit 145, and limits $I_{b2}$ to a magnitude for operating transistor 45 at safe levels below its rated power dissipation.

What is claimed is:
1. A switching circuit, comprising:
  a power terminal for receiving a first operating voltage;
  bipolar switching transistor means having a collector electrode connected to said power terminal, an emitter electrode for receiving a source of reference potential, and a base electrode for receiving a control current;
  a first terminal for receiving a first control signal;
  programmable current supply means connected between said first terminal and the base electrode of said bipolar switching transistor means responsive to said first control signal having a first level of voltage, sequentially (1) initially supplying current of sufficient magnitude to said base electrode and turning on said transistor means at least into an unsaturated conduction state, (2) a predetermined time thereafter increasing the magnitude of current being supplied to said base electrode to further drive said transistor toward saturation, depending upon the characteristics of a load being driven by said circuit, for minimizing the power dissipation of said transistor means thereafter said current supply means is responsive to said first control signal having a second level of voltage for (3) reducing the magnitude of current being supplied to said base electrode a sufficient amount for ensuring said transistor means is placed into an unsaturated conduction state, and (4) a predetermined time thereafter further reducing the magnitude of current being supplied to said base electrode to substantially zero, for turning off said transistor.

2. The switching circuit of claim 1, wherein said programmable current supply means, includes:

first current supply means connected between said first terminal and said base electrode, responsive to the level of said control signal being at its first level of voltage for supplying a first current to said base electrode for satisfying sequence (1) of said programmable current supply means; and second current supply means connected between said first terminal and said base electrode, responsive to the level of said control signal being at its first level, a predetermined time after said first current supply means responds to the control signal, for supplying a second current to said base electrode concurrent with said first current, for satisfying sequence (2) of said programmable current supply means;

said first current supply means being responsive to the level of said first control signal going from its first to its second level of voltage, for reducing to substantially zero the magnitude of said first current, for satisfying sequence (3) of said programmable current supply means, said second current supply means being responsive to this change in level of said first control signal a predetermined time after said first current supply means, for reducing to substantially zero the magnitude of said second current, for satisfying sequence (4) of said programmable current supply means.

3. The switching circuit of claim 2, wherein said first current supply means, includes:

a second terminal for receiving a second operating voltage;

first current control means having a main current carrying path connected between said second terminal and the base electrode of said bipolar switching transistor means, and a control electrode for receiving a second control signal; and first logic means connected between said first terminal and the control electrode of said first current control means, said first logic means being responsive to said first control signal having its first level of voltage for producing a second control signal at a first level of voltage, said first current control means responding to latter by substantially lowering the impedance of its main current path for supplying said first current to said base electrode of said bipolar switching transistor means, and first logic means being responsive to the level of voltage of said first control signal changing to its second level, for changing the level of said second control signal to a second level of voltage, said first current control means responding to this latter level change by substantially increasing the impedance of its main current path, thereby reducing the magnitude of said first current to substantially zero.

4. The switching circuit of claim 3, wherein said first logic means further includes:

means for automatically reducing the level of voltage of said second control signal from its first level to a third level between its first and second levels a predetermined period of time after the level of voltage of said first control signal changes from its second to its first level, said current control means being responsive to the first level of voltage of said second control signal for supplying said first current at a magnitude for overdriving said bipolar switching transistor means, and responsive to the third level of voltage of said second control signal for supplying said first current at a magnitude for maintaining said bipolar switching means in at least an unsaturated conduction state, thereby providing fast turn-on of the latter.

5. The switching circuit of claim 4, wherein said first logic means includes:

an inverter having an input terminal coupled to said first terminal and an output terminal connected to the control electrode of said first current control means;

third and fourth terminals for receiving a third operating voltage, and a source of reference potential, respectively;

a first resistor connected between said third terminal and the output terminal of said inverter;

unidirectional current flow means having one end connected to said output terminal of said inverter;

electrical charge storage means connected between the other end of said unidirectional current flow means and said fourth terminal, said unidirectional current means being poled for blocking current flow between said electrical charge storage means and the common connection of said first resistor, control electrode of said current control means, and output terminal of said inverter; and a second resistor connected between the input terminal of said inverter and the common connection between said unidirectional current flow means and electrical charge storage means;

said means for automatically reducing the level of voltage of said second control signal consisting of the combination of said first and second resistors, said unidirectional current flow means, and said electrical charge storage means, whereby when the first control signal is at its second level of voltage, said electrical charge storage means takes on charge via the flow of current in one direction between the input terminal of said inverter and said fourth terminal via a current path including said second resistor and said electrical charge storage means, the charging time being of sufficient duration for causing the voltage across said electrical charge storage means to substantially approach the level of said third operating voltage, thereafter when the level of said first control signal is changed from its second to its first level, initially the voltage across said electrical charge storage means substantially back biases said unidirectional current flow means, causing the first level of said second control signal to substantially approach that of said third operating voltage, a relatively short time thereafter said electrical charge storage means begins to discharge via current flow in the opposite direction through said second resistor, causing the voltage across said charge storage means to exponentially decrease, forward biasing said unidirectional current flow means, in turn causing current to flow in said opposite direction through the current path including said first and second resistors and said unidirectional current flow means, and the level of said second control signal to reduce to its second level as substantially determined by the relative values of resistance of said first and second resistors, these resistors forming a voltage divider circuit at times that said unidirectional current flow means is forward biased.

6. The switching circuit of claim 3, wherein said current control means includes a vertical metal oxide semiconductor switch having a drain electrode connected to said second terminal, a source electrode connected to the base electrode of said bipolar switching transistor means, and a gate electrode serving as its control electrode, its main current path including said drain and source electrodes.

7. The switching curcuit of claim 5, wherein said unidirectional current flow means consists of a diode.

8. The switching circuit of claim 5, wherein said electrical charge storage means consists of a capacitor.

9. The switching circuit of claim 2, wherein said second current supply means, includes:
current control means having a main current path connected between said collector and base electrodes of said bipolar switching transistor means, and a control electrode for receiving a second control signal; and
logic means connected between said first terminal and the control electrode of said current control means, said logic means being responsive to said first control signal changing from its second to its first level of voltage, for producing said second control signal at a first level of voltage a predetermined time after said first current supply means responds to this level change of said first control signal for supplying said second current to the base of said bipolar switching transistor means, said current control means being responsive to said second control signal at its first level of voltage for substantially reducing the impedance of its main current path, thereby both (1) permitting said second current to flow through the main current path, concurrently into said base electrode with said first current, and (2) providing a positive feedback path for current between said collector and base electrodes, said logic means being responsive thereafter to the level of voltage of said first control signal changing to its second level, for changing the level of said second control signal to a second level of voltage a predetermined time after said first current supply reduces to substantially zero the magnitude of said first current, said current control means being responsive to the change in level of said second control signal for substantially increasing the impedance of its main current path, thereby substantially reducing the magnitude of said second current to substantially zero.

10. The switching circuit of claim 9, wherein said logic means includes:
first through third inverters serially connected between said first terminal and the control electrode of said current control means, each one of said inverters having an input and output terminal, the input terminal of said first inverter being connected to said first terminal, the output terminal of said third inverter being connected to said control electrode;
first and second integrating circuit means individually connected to the input terminals of said second and third inverters, respectively, for delaying a predetermined time the response of said first through third serially connected inverters to changes in the level of said first control signal, thereby substantially providing the timing between the operation of said first and second current supplies in response to changes in the level of said first control signal.

11. The switching circuit of claim 9, wherein said current control means consists of a vertical metal oxide semiconductor switch.

12. The switching circuit of claim 10, wherein said first and second integrating circuit means, includes:
second and third terminals for receiving a third operating voltage, and a source of reference potential, respectively;
said first integrating circuit consisting of a first resistor connected between said second terminal and the input terminal of said second inverter, and a first capacitor connected between the latter and said third terminal; and
said second integrating circuit consisting of a second resistor connected between said second terminal and the input terminal of said third inverter, and a second capacitor connected between the latter and said third terminal.

13. The switching circuit of claim 3, wherein said second current supply means, includes:
second current control means having a main current carrying path connected between said collector and base electrodes of said bipolar switching transistor means, and a control electrode for receiving a third control signal;
second logic means connected between said first terminal and the control electrode of said second current control means, said second logic means being responsive to the voltage level of said first control signal changing from its second to its first level for producing and changing the voltage level of a third control signal from a second to a first level a predetermined time after said first logic means changes the voltage level of said second control signal from its second to its first level, said second current control means responding to the change in level of said third control signal to its first level by substantially lowering the impedance of its main current path, thereby permitting said second current to flow from said power terminal into said base electrode, its main current path also providing at this time positive feedback between said collector and base electrodes, thereafter said second logic means being responsive to the level of said first control signal changing to its second level, for changing the level of said third control signal back to its second level a prdetermined time after said first logic means changes the level of said second control signal back to its second level, said second current control means responding to the latter level change of said third control signal by substantially increasing the impedance of its main current path, thereby substantially reducing the magnitude of said second current to zero, turning off said bipolar transistor switching means.

14. The switching circuit of claim 13, wherein said second current control means consists of a vertical metal oxide semiconductor switch having a gate electrode for said control electrode, a drain electrode connected to said collector electrode, a source electrode connected to said base electrode, its main current path being between and including said drain and source electrodes.

15. The switching circuit of claims 1 or 9 or 13, wherein said bipolar switching transistor means includes:
   a bipolar transistor having said collector, emitter, and base electrodes; and
   a relatively low value resistor connected across said base and emitter electrodes.

16. The switching circuit of claim 15 wherein said bipolar switching transistor means further includes a diode connected in inverse parallel between said collector and emitter electrodes for providing bilateral current flow.

17. The switching circuit of claim 13, further including:
   current sensing means connected between the main current path of said second current control means and the base electrode of said bipolar transistor switching means, for providing whenever said second current control means is turned on a monitoring voltage having an amplitude analogous to the magnitude of current flowing through the collector-emitter electrode current path of said bipolar transistor switching means; and
   third logic means connected across said current sensing means, responsive to said monitoring voltage exceeding a predetermined amplitude for applying independently to the control electrodes of said first and second current control means first and second turn-off voltages, respectively, of sufficient amplitude and proper polarity for turning off said first and second current control means if conducting, regardless of the level of said second and third control signals, thereby turning off said bipolar switching transistor means, said third logic means thereafter being responsive to said monitoring voltage decreasing to below said predetermined amplitude for removing said turn-off voltages from the control electrodes of said first and second control means.

18. The switching circuit of claim 17, wherein said current sensing means further includes delay means for delaying for a predetermined time the application to said third logic means of changes in the amplitude of said monitoring voltage, thereby ensuring that relatively short term positive transients in the magnitude of current flowing through said current sensing means, causing said monitoring voltage to exceed the predetermined amplitude for the transient period, are not responded to by said third logic means, preventing false triggering thereof by such short-lived transients which are not harmful to the operation of said bipolar switching transistor means.

19. The switching circuit of claims 17 or 18, wherein said third logic means includes:
   voltage level detecting means having a control electrode receptive of said monitoring voltage, and an output terminal, responsive to said monitoring voltage exceeding the predetermined amplitude for changing the level of voltage at its output terminal from a first to a second level, and thereafter responsive to the amplitude of said monitoring voltage reducing to below the predetermined amplitude, for changing the level of voltage at its output terminal back to the second level;
   a monostable multivibrator having an input terminal connected to the output terminal of said voltage level detecting means and an output terminal, responsive to the output voltage of said level detecting means changing to its second level, for producing a "high" level signal at its output terminal, and thereafter responsive to said output voltage from said level detecting means changing back to its first level, for producing a "low" level signal at its output terminal; and
   first and second inverter means each having an input terminal connected in common to said output terminal of said analog switching means, and each having an output terminal connected to said control electrodes of said first and second current control means, respectively, said first and second inverter means being responsive (1) to a "high" level output signal from said monostable multivibrator, for producing at their output terminals said first and second turn-off voltages, respectively, and thereafter (2) responsive to a "low" level output signal from said monostable multivibrator for removing said first and second turn-off voltages from their output terminals, respectively.

20. The switching circuit of claim 17, wherein said current sensing means includes a relatively low value resistor connected between the main current path of said second current control means and the base electrode of said bipolar switching transistor means, said monitoring voltage being developed across said resistor.

21. The switching circuit of claim 18, wherein said delay means includes:
   a first resistor of relatively low resistance connected between the main current path of said second current control means, and said base electrode of the bipolar switching transistor means;
   a second resistor having one end connected to the common connection between said first resistor and the main current path of said second current control means; and
   a capacitor connected between the other end of said second resistor and the base electrode of said bipolar switching transistor means, whereby the voltage developed across said first resistor is integrated by the combination of said second resistor and capacitor, said monitoring voltage being developed across said capacitor in an exponentially increasing or decreasing manner, for increasing or decreasing changes in the amplitude of voltage developed across said first resistor, the predetermined delay time being substantially determined by the product of the values of said second resistor and capacitor.

22. The switching circuit of claims 1 or 9 or 13 wherein said bipolar switching transistor means includes a pair of bipolar switching transistors connected in a Darlington configuration.

23. The switching circuit of claim 22, wherein said pair of bipolar transistors each have base and emitter electrodes, and said bipolar switching transistor means further includes:

a first resistor having a relatively low value connected between the base and emitter electrodes of one of said pair of bipolar transistor; and a second resistor having a relatively low value connected between the base and emitter electrodes of the other of said pair of bipolar transistors.

24. The switching circuit of claims 1, or 9 or 13, wherein said bipolar switching transistor means includes a bipolar switching transistor having said base, emitter, and collector electrodes.

25. The switching circuit of claim 24 further including another switching transistor means having a main current path connected between said base and emitter electrodes of said bipolar switching transistor means, said another switching transistor means being selectively operable to a conductive state for reducing the impedance of its main current path from a relatively high value to a relatively low value just prior to reducing the magnitude of base current to said bipolar switching transistor to zero, thereby ensuring the turn-off of this transistor with zero bias at its base electrode, said another switching transistor means being operable to a non-conductive state for maintaining the impedance of its main current path at a relatively high value during a substantial period of the time that said bipolar transistor is turned on.

26. A method for operating a bipolar power transistor switch having a collector electrode receptive of an operating voltage, a base electrode for receiving a control signal, and an emitter electrode for receiving a source of reference potential, whereby amongst other requirements interelectrode capacitances of said transistor must be charged at the initiation of a given turn-on cycle, before said transistor turns on, and discharged at the initiation of a given turn-off cycle before said transistor turns off, comprising the steps of:

supplying a current of predetermined magnitude to said base electrode for both initiating the turn-on cycle and turning on said transistor into at least an unsaturated conduction state;

increasing the magnitude of the current supplied to said base electrode in a step-like manner a sufficient amount for placing said transistor into or as close as possible to a saturated conduction state, depending upon the characteristics of a load being driven by said bipolar transistor switch, for minimizing the power dissipation thereof; and decreasing the magnitude of the current supplied to said base electrode in a step-like manner first a sufficient amount for both initiating the turn-off cycle and ensuring the placement of said transistor into an unsaturated conduction state, and thereafter second to a magnitude of zero for completing the turn-off of said transistor.

27. The method of claim 26, further including the step of providing negative feedback between the collector and base electrodes of said transistor after it is placed in a saturated conduction state, for enhancing the transient capability of said transistor.

28. The method of claim 26, wherein the step of increasing the magnitude of the current supplied to said base electrode consists of adding another current to the current supplied in the first step at the base electrode of said transistor.

29. A method for operating a bipolar power transistor switch having a collector electrode receptive of an operating voltage, a base electrode, an emitter electrode, and interelectrode capacitance for connection to a point of reference potential, comprising the steps of:

initiating the turn-on cycle for said transistor by supplying a first current to said base electrode for turning on said transistor into at least an unsaturated conduction state, whereby said interelectrode capacitances take on charge:

supplying concurrent with said first current, a second current to said base electrode a predetermined time after turning on said transistor, the sum of the magnitudes of the first and second currents being sufficient for placing said transistor into or as close as possible to a saturated conduction state, depending upon the characteristics of a load being driven by said transistor switch for minimizing the power dissipation thereof;

providing negative feedback between the collector and base electrodes so that whenever the voltage at said collector electrode increases due to some electrical transient conduction, greater base current is supplied for substantially maintaining said transistor in a saturated conduction state, thereby improving the transient capability of said transistor and further minimizing the power dissipation thereof;

initiating the turn-off cycle for said transistor by removing said first current from said base electrode for placing saids transistor back into an unsaturated conduction state, whereby said interelectrode capacitances partially discharge; and removing said second current from said base electrode for completing the turn-off of said transistor.

30. A high-power switching circuit, comprising:

bipolar switching transistor means having a collector electrode for receiving a first operating voltage, a base electrode, and an emitter electrode for connection to a point of reference potential;

a first vertical metal oxide semiconductor (VMOS) field effect transistor having a gate electrode receptive of a first control signal, drain and source electrodes connected individually to the collector and base electrodes, respectively, of said bipolar transistor switching means, said first VMOS being responsive to said first control signal for turning on to substantially lower the impedance between its source and drain electrodes, permitting current flow therebetween; and current control means having a control electrode receptive of a second control signal, a first electrode for receiving a second operating voltage, and a second electrode connected to said base electrode of said first switching means, said current control means being responsive to said second control signal for turning on to substantially lower the impedance between its first and second electrodes, thereby permitting current to flow between its first and second electrodes;

said current control means being turned on prior to first VMOS transistor for initiating current flow through the base-emitter electrode current path of said bipolar switching transistor means thereby turning on said bipolar switching transistor means into at least an unsaturated conductive state, thereafter said first VMOS transistor being turned on for supplying sufficient additional current flow through the base-emitter electrodes of said bipolar switching transistor means, for causing the latter to operate in a saturated conductive state, or as close to a saturated state as possible depending upon the characteristics of a load being driven by said curcuit, said first VMOS and current control means being thereafter concurrently turned on for a substantial period of the total conduction time of said bipolar switching transistor means, thereby minimizing the power dissipation of the latter, said first VMOS transistor when conductive providing negative feedback between the collector and base electrodes of first switching device, thereby improving the transient capability of the latter, turn off of said bipolar switching transistor means being initiated by first turning off said current control means, for ensuring said bipolar switching transistor means is placed into a non-saturated conductive state, thereafter said first VMOS transistor is turned off for substantially reducing to zero the magnitude of current flow between the base and emitter electrodes of said bipolar switching transistor means, turning off the latter, such sequence of operation of said second switching means and VMOS transistor also substantially reducing the turn-on and turn-off times of said bipolar switching transistor means.

31. The high-power switching circuit of claim 30, wherein said current control means includes a second VMOS transistor having a gate electrode as said control electrode, a drain electrode as said first electrode, and a source electrode as said second electrode.

32. The high-power switching circuit of claim 30, wherein said bipolar switching transistor means includes an NPN power switching transistor.

33. The high-power switching circuit of claim 32, wherein said bipolar switching transistor means further includes a relatively low value resistor connected between the base and emitter electrodes of said NPN power switching transistor.

34. The high-power switching circuit of claim 30, wherein said bipolar switching transistor means includes first and second bipolar transistors connected in a Darlington configuration, said first transistor having a base electrode connected as the base electrode of said bipolar switching transistor means, a collector electrode, and an emitter electrode, said second transistor having a base electrode connected to the emitter electrode of said first bipolar transistor a collector electrode connected in common to the collector electrode of said first transistor for receiving said first operating voltage, and emitter electrode for connection to said point of reference potential.

35. The high-power switching circuit of claim 34, wherein said bipolar switching transistor means further includes:
first and second resistors each having a relatively low value of resistance connected betwen the base and emitter electrodes of said first and second transistors, respectively.

36. The high-power switching circuit of claim 30, further including:
current sensing means connected between the source electrode of said first VMOS transistor and the base electrode of said bipolar transistor switching means, the voltage developed across said current sensing means being analogous to the magnitude of current flowing into the collector electrode of said bipolar transistor switching means; and
logic means connected across said current sensing means, and responsive to the voltage developed thereacross exceeding a predetermined level, for applying individual turn-off voltages of appropriate polarity and voltage level to the gate electrode of said first VMOS transistor, and control electrode of said current control means, for turning them off, if either was previously turned on, regardless of the presence of either or both of said first and second control signals, thereby reducing the magnitude of current to zero in the base-emitter current path of said bipolar switching transistor means, turning off and in this manner protecting the latter from excess power dissipation.

37. The high-power switching circuit of claim 36, wherein said logic means further includes delay means for delaying for a predetermined time the response of said logic means to the voltage across said current sensing means exceeding a predetermined level, thereby preventing false triggering of said logic means by short-lived transient increases in the magnitude of collector current of said bipolar switching transistor means.

* * * * *